United States Patent
Inazumi et al.

(10) Patent No.: US 8,774,426 B2
(45) Date of Patent: Jul. 8, 2014

(54) SIGNAL PROCESSING APPARATUS, SEMICONDUCTOR CHIP, SIGNAL PROCESSING SYSTEM, AND METHOD OF PROCESSING SIGNAL

(75) Inventors: Masanori Inazumi, Tokyo (JP); Naotaka Saito, Tokyo (JP)

(73) Assignee: Lapis Semiconductor Co., Ltd., Yokohama (JP)

(*) Notice: Subject to any disclaimer, the term of this patent is extended or adjusted under 35 U.S.C. 154(b) by 402 days.

(21) Appl. No.: 13/172,013

(22) Filed: Jun. 29, 2011

(65) Prior Publication Data
US 2012/0014539 A1    Jan. 19, 2012

(30) Foreign Application Priority Data

Jul. 16, 2010 (JP) ................................ 2010-162179

(51) Int. Cl.
- *H03G 3/00* (2006.01)
- *H03G 9/00* (2006.01)
- *H04B 15/00* (2006.01)
- *H03G 5/16* (2006.01)

(52) U.S. Cl.
CPC ..................................... *H03G 5/165* (2013.01)
USPC ........... 381/107; 381/94.2; 381/102; 381/104

(58) Field of Classification Search
CPC ......... H03G 3/00; H03G 9/00; H03G 3/3005; H04B 15/00

USPC ................... 381/107, 104, 102, 56, 122, 94.2
See application file for complete search history.

(56) References Cited

U.S. PATENT DOCUMENTS 5,550,925 A * 8/1996 Hori et al. ..................... 381/98

FOREIGN PATENT DOCUMENTS

JP              06-319193        11/1994

* cited by examiner

*Primary Examiner* — Vivian Chin
*Assistant Examiner* — Douglas Suthers
(74) *Attorney, Agent, or Firm* — Kubotera & Associates, LLC (57) ABSTRACT

In a signal processing apparatus, a high frequency level detecting unit detects a level of a high frequency component adjusted with a first adjusting unit, and a first control unit controls a first gain of the adjusting unit according to the level of the high frequency component thus detected. Further, a low frequency level detecting unit detects a level of a low frequency component adjusted with a second adjusting unit. A second control unit controls a second gain according to the level of the high frequency component and the level of the low frequency component thus adjusted, so that a difference between the level of the high frequency component adjusted with the first adjusting unit and the level of the low frequency component adjusted with the second adjusting unit becomes smaller than a specific level determined in advance.

10 Claims, 6 Drawing Sheets

SIGNAL PROCESSING APPARATUS, SEMICONDUCTOR CHIP, SIGNAL PROCESSING SYSTEM, AND METHOD OF PROCESSING SIGNAL

BACKGROUND OF THE INVENTION AND RELATED ART STATEMENT

The present invention relates to a signal processing apparatus, a semiconductor chip, a signal processing system, and a method of processing a signal.

A conventional signal processing apparatus is disposed on an input path for recording an audio signal, so that the conventional signal processing apparatus adjusts audio quality of the audio signal thus input. For example, when a voice is captured and recorded through a microphone, the conventional signal processing apparatus is provided for reducing a wind noise generated by wind blowing into the microphone.

Figure 4:
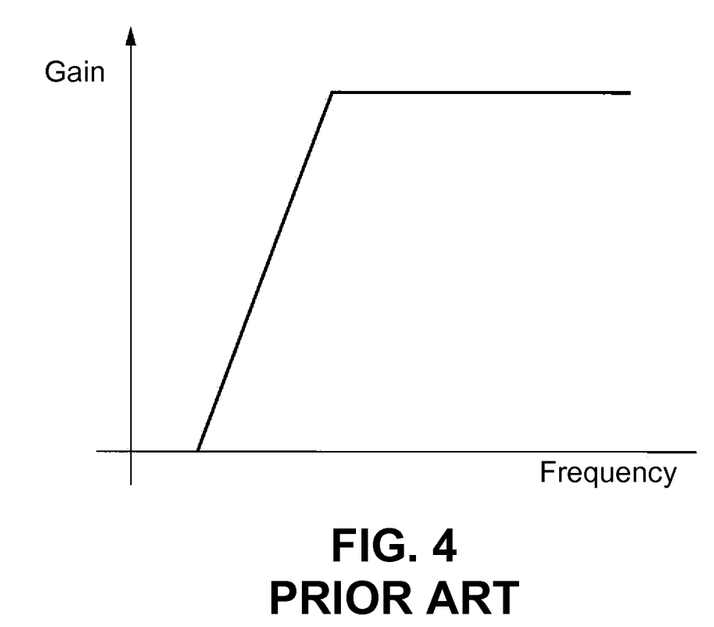
FIG. 4 is a graph showing a frequency characteristic of a high pass filter (an HPF) of a conventional signal processing apparatus.

FIG. 4 is a graph showing a frequency characteristic of a high pass filter (an HPF) of the conventional signal processing apparatus. In general, a wind noise contains a large noise component in a low frequency range. Accordingly, the conventional signal processing apparatus is provided with the HPF for eliminating the large noise component in the low frequency range. However, when the audio signal is processed only with the HPF, any component in the low frequency range is reduced even when there is little wind noise. Accordingly, a necessary audio component such as an environmental sound may be reduced as well, thereby making it difficult to obtain high audio quality.

Figure 5:
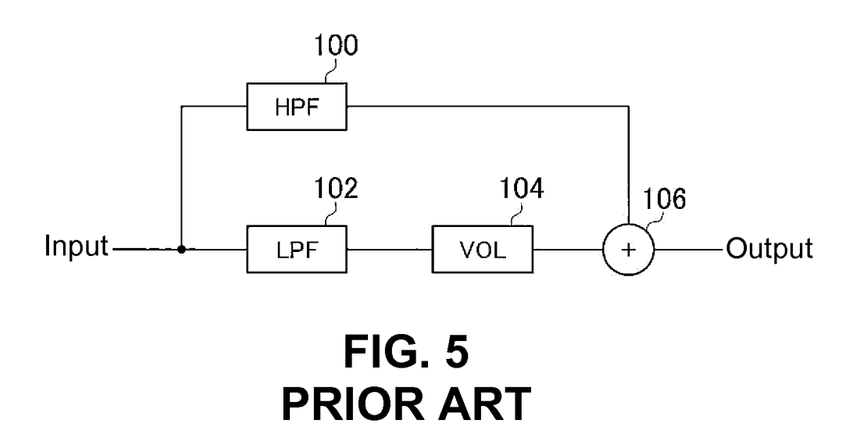
FIG. 5 is a block diagram showing a configuration of a conventional signal processing apparatus.

FIG. 5 is a block diagram showing a configuration of the conventional signal processing apparatus. As shown in FIG. 5, the conventional signal processing apparatus includes a wind noise filter having a high pass filter 100 (an HPF) and a low pass filter 102 (an LPF). An audio signal is input into the HPF 100 and the LPF 102. The HPF 100 is provided for extracting a high frequency component including a human voice from the audio signal thus input. The LPF 102 is provided for extracting a low frequency component from the audio signal thus input. A signal output from the LPF 102 is input to a volume adjusting circuit 104 (VOL) as an attenuator with a constant gain, so that the VOL 104 attenuates and outputs the low frequency component. An accumulator 106 is provided for accumulating (combining) a signal output from the VOL 104 with a signal output from the HPF 100.

In the conventional signal processing apparatus having the wind noise filter as shown in FIG. 5, the low frequency component, in which a wind noise causes a problem most, is reduced. With the configuration shown in FIG. 5, the low frequency component is not completely eliminated, but rather maintained at a specific level while a wind noise is reduced.

Figure 6:
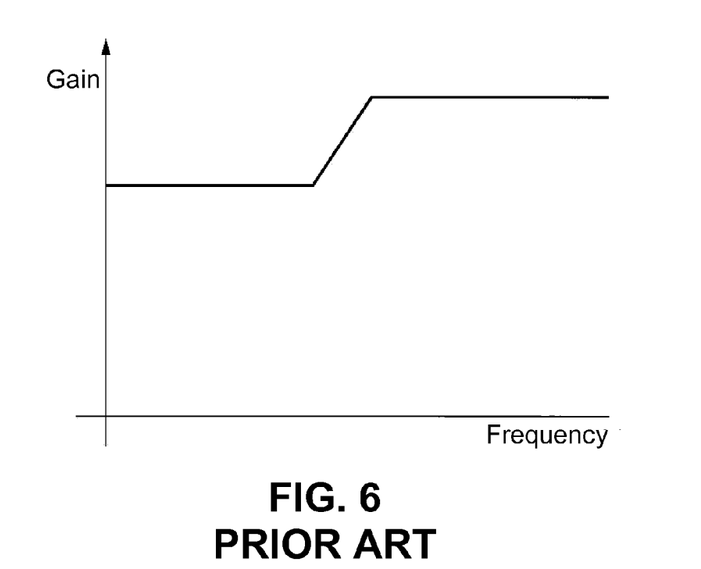
FIG. 6 is a graph showing a frequency characteristic of the wind noise filter having the high pass filter (the HPF) and a low pass filter (an LPF) of the conventional signal processing apparatus.

FIG. 6 is a graph showing a frequency characteristic of the wind noise filter having the high pass filter 100 (the HPF) and the low pass filter 102 (the LPF) of the conventional signal processing apparatus. As shown in FIG. 6, when the conventional signal processing apparatus is provided with the wind noise filter having the HPF 100 and the LPF 102, it is possible to obtain better audio quality even when a wind noise is small as compared with the conventional signal processing apparatus provided with only the HPF.

Patent Reference: Japanese Patent Publication No. 06-319193

Patent Reference has disclosed another conventional signal processing apparatus. The conventional signal processing apparatus disclosed in Patent Reference includes a unit for determining a gain to attenuate the low frequency component according to an audio intensity difference between the high frequency component passing through the HPF and the low frequency component passing through the LPF.

Figure 7:
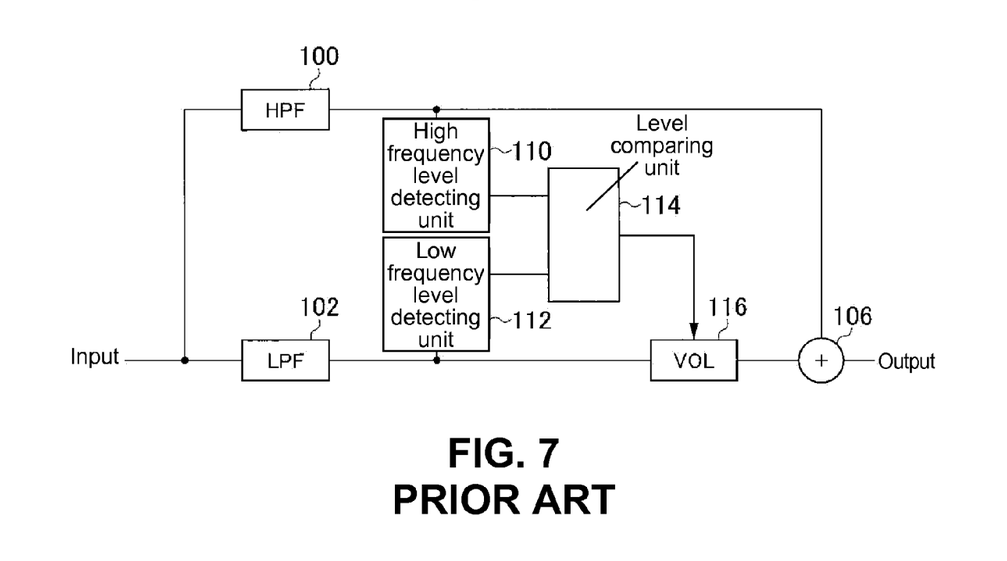
FIG. 7 is a block diagram showing a configuration of a conventional signal processing apparatus.

FIG. 7 is a block diagram showing a configuration of the conventional signal processing apparatus disclosed in Patent Reference. Components shown in FIG. 7 and similar to those in FIG. 5 are designated with the same reference numerals, and explanations thereof are omitted.

In the conventional signal processing apparatus shown in FIG. 7, a signal output from the HPF 100 is input to a high frequency level detecting unit 110, so that the high frequency level detecting unit 110 detects a level of the signal output from the HPF 100. A signal output from the LPF 102 is input to a low frequency level detecting unit 112, so that the low frequency level detecting unit 112 detects a level of the signal output from the LPF 102.

Further, the signal output from the LPF 102 is input to a volume adjusting circuit 116 (VOL) as an attenuator with a variable gain, so that the VOL 116 attenuates and outputs the low frequency component. The accumulator 106 is provided for accumulating (combining) a signal output from the VOL 116 with the signal output from the HPF 100.

In the conventional signal processing apparatus shown in FIG. 7, a level comparing unit 114 is provided for determining the variable gain of the VOL 116. More specifically, the level comparing unit 114 compares the detection result input from the high frequency level detecting unit 110 with the detection result input from the low frequency level detecting unit 112.

When the low frequency level is not so high as opposed to the high frequency level, indicating that a wind noise is not so high, the level comparing unit 114 sets the variable gain of the VOL 116 so that the low frequency level is not reduced excessively. When the low frequency level is significantly high as compared with the high frequency level, indicating that a wind noise is very high, the level comparing unit 114 sets the variable gain of the VOL 116 so that the low frequency level is reduced accordingly.

Figure 8:
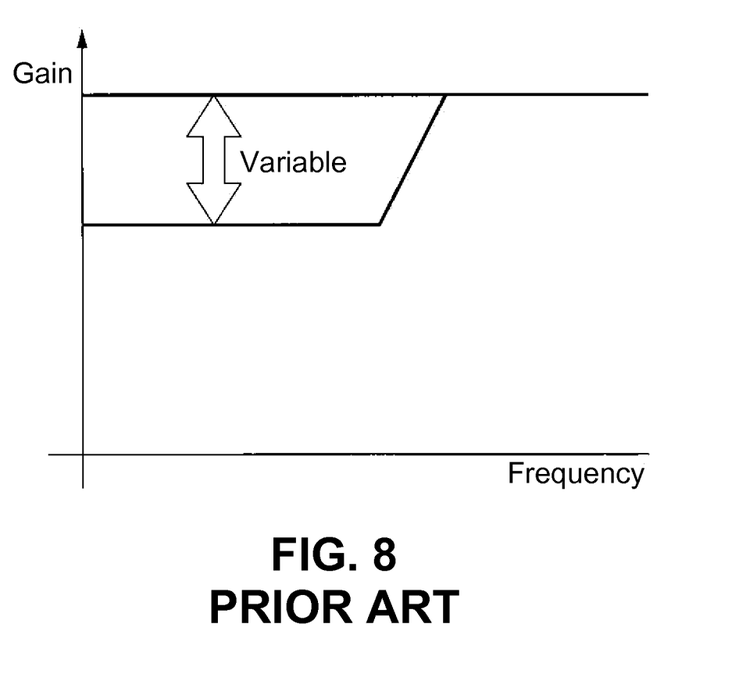
FIG. 8 is a graph showing a frequency characteristic of a wind noise filter having the high pass filter (the HPF) and the low pass filter (the LPF) of the conventional signal processing apparatus.

FIG. 8 is a graph showing a frequency characteristic of the wind noise filter having the high pass filter 100 (the HPF) and the low pass filter 102 (the LPF) of the conventional signal processing apparatus disclosed in Patent Reference. As shown in FIG. 8, when the conventional signal processing apparatus is provided with the unit for determining the gain to attenuate the low frequency component, it is possible to obtain the frequency characteristic in which only the low frequency level is variable. More specifically, when a wind noise is not so high, the low frequency level is not reduced excessively. When the wind noise is very high, the low frequency level is reduced accordingly. As a result, it is possible to obtain better audio quality even when the wind noise is small as compared with the conventional signal processing apparatus shown in FIG. 5.

In the conventional signal processing apparatus shown in FIG. 7, an auto level controller is normally provided as a later stage unit for amplifying a signal output from the accumulator 106. However, the auto level controller is designed to amplify the signal such that a whole wave shape is maintained at a constant level. Accordingly, it is difficult to adjust a volume according to a human voice, which is a main subject of listening, thereby making it difficult to obtain a resultant audio signal with high quality for being easily discernable.

In view of the problems described above, an object of the present invention is to provide a signal processing apparatus capable of solving the problems of the conventional signal processing apparatus. A further object of the present invention is to provide a semiconductor chip, a signal processing system, and a method of processing a signal. In the present invention, it is possible to obtain an audio signal with high quality for being easily discernable as well as reduce a wind noise.

Further objects and advantages of the invention will be apparent from the following description of the invention.

SUMMARY OF THE INVENTION

In order to attain the objects described above, according to a first aspect of the present invention, a signal processing apparatus includes a high frequency component extracting unit for extracting a high frequency component higher than a specific frequency from an audio signal; a low frequency component extracting unit for extracting a low frequency component lower than a specific frequency from the audio signal; a first adjusting unit for amplifying a level of the high frequency component extracted with the high frequency component extracting unit with a first gain; a second adjusting unit for amplifying or attenuating a level of the low frequency component extracted with the low frequency component extracting unit with a second gain; and an accumulating unit for accumulating the high frequency component adjusted with the first adjusting unit and the low frequency component adjusted with the second adjusting unit.

According to the first aspect of the present invention, the signal processing apparatus further includes a high frequency level detecting unit for detecting the level of the high frequency component adjusted with the first adjusting unit; a low frequency level detecting unit for detecting the level of the low frequency component adjusted with the second adjusting unit; a first control unit for controlling the first gain according to the level of the high frequency component detected with the high frequency level detecting unit so that the first adjusting unit amplifies the level of the high frequency component to a target level; and a second control unit for controlling the second gain according to the level of the high frequency component detected with the high frequency level detecting unit and the level of the low frequency component detected with the low frequency level detecting unit so that a difference between the level of the high frequency component adjusted with the first adjusting unit and the level of the low frequency component adjusted with the second adjusting unit becomes smaller than a specific level determined in advance.

As described above, in the signal processing apparatus in the first aspect of the present invention, the high frequency level detecting unit detects the level of the high frequency component adjusted with the first adjusting unit, and the first control unit controls the first gain of the adjusting unit according to the level of the high frequency component thus detected. Further, the low frequency level detecting unit detects the level of the low frequency component adjusted with the second adjusting unit. The second control unit controls the second gain according to the level of the high frequency component and the level of the low frequency component thus adjusted, so that the difference between the level of the high frequency component adjusted with the first adjusting unit and the level of the low frequency component adjusted with the second adjusting unit becomes smaller than the specific level determined in advance.

Accordingly, in the signal processing apparatus in the first aspect of the present invention, it is possible to obtain an audio signal with better quality for being easily discernable as compared with a conventional signal processing apparatus, in which a level of a low frequency component is attenuated and accumulated with a high frequency component without adjusting a level, and a level of a whole signal after the accumulation is amplified.

According to a second aspect of the present invention, in the signal processing apparatus in the first aspect of the present invention, the second control unit may be arranged to control the second gain of the second adjusting unit so that the second adjusting unit amplifies the level of the low frequency component with the second gain equal to the first gain when the level of the high frequency component detected with the high frequency level detecting unit is equal to the target level and the level of the low frequency component detected with the low frequency level detecting unit is smaller than the target level.

Further, according to the second aspect of the present invention, in the signal processing apparatus in the first aspect of the present invention, the second control unit may be arranged to control the second gain of the second adjusting unit so that the second adjusting unit attenuates the level of the low frequency component with the second gain smaller than the first gain by a first value determined in advance when the level of the high frequency component detected with the high frequency level detecting unit is equal to the target level and the level of the low frequency component detected with the low frequency level detecting unit is greater than the target level.

Further, according to the second aspect of the present invention, in the signal processing apparatus in the first aspect of the present invention, the second control unit may be arranged to control the second gain of the second adjusting unit so that the second adjusting unit attenuates the level of the low frequency component with the second gain smaller than the first gain by a second value greater than the first value when the level of the high frequency component detected with the high frequency level detecting unit is smaller than the target level.

According to a third aspect of the present invention, in the signal processing apparatus in the first aspect of the present invention, the second control unit may be arranged to control the second gain of the second adjusting unit so that the second adjusting unit amplifies the level of the low frequency component with the second gain equal to the first gain when the level of the high frequency component detected with the high frequency level detecting unit is within a range determined in advance including the target level and the level of the low frequency component detected with the low frequency level detecting unit is smaller than an upper limit of the range.

Further, according to the third aspect of the present invention, in the signal processing apparatus in the first aspect of the present invention, the second control unit may be arranged to control the second gain of the second adjusting unit so that the second adjusting unit attenuates the level of the low frequency component with the second gain smaller than the first gain by a first value determined in advance when the level of the high frequency component detected with the high frequency level detecting unit is within the range and the level of the low frequency component detected with the low frequency level detecting unit is greater than the upper limit of the range.

Further, according to the third aspect of the present invention, in the signal processing apparatus in the first aspect of the present invention, the second control unit may be arranged to control the second gain of the second adjusting unit so that the second adjusting unit attenuates the level of the low frequency component with the second gain smaller than the first gain by a second value greater than the first value when the level of the high frequency component detected with the high frequency level detecting unit is smaller than a lower limit of the range.

According to a fourth aspect of the present invention, the signal processing apparatus in one of the first to third aspects of the present invention may be disposed in a semiconductor chip.

According to a fifth aspect of the present invention, a signal processing system includes an input device including an analog amplifying unit for amplifying an analog audio signal and a conversion unit for converting the analog audio signal amplified with the analog amplifying unit to a digital audio signal.

According to the fifth aspect of the present invention, the signal processing system further includes a high frequency component extracting unit for extracting a high frequency component higher than a specific frequency from the digital audio signal converted with the conversion unit of the input device; a low frequency component extracting unit for extracting a low frequency component lower than a specific frequency from the digital audio signal converted with the conversion unit of the input device; a first adjusting unit for amplifying a level of the high frequency component extracted with the high frequency component extracting unit with a first gain; a second adjusting unit for amplifying or attenuating a level of the low frequency component extracted with the low frequency component extracting unit with a second gain; and an accumulating unit for accumulating the high frequency component adjusted with the first adjusting unit and the low frequency component adjusted with the second adjusting unit.

According to the fifth aspect of the present invention, the signal processing system further includes a high frequency level detecting unit for detecting the level of the high frequency component adjusted with the first adjusting unit; a low frequency level detecting unit for detecting the level of the low frequency component adjusted with the second adjusting unit; a first control unit for controlling the first gain according to the level of the high frequency component detected with the high frequency level detecting unit so that the first adjusting unit amplifies the level of the high frequency component to a target level; and a second control unit for controlling the second gain according to the level of the high frequency component detected with the high frequency level detecting unit and the level of the low frequency component detected with the low frequency level detecting unit so that a difference between the level of the high frequency component adjusted with the first adjusting unit and the level of the low frequency component adjusted with the second adjusting unit becomes smaller than a specific level determined in advance.

As described above, in the signal processing system in the fifth aspect of the present invention, it is possible to obtain an effect similar to that in the first aspect of the present invention. Accordingly, in the signal processing apparatus in the first aspect of the present invention, it is possible to obtain an audio signal with better quality for being easily discernable as compared with a conventional signal processing system, in which a level of a low frequency component is attenuated and accumulated with a high frequency component without adjusting a level, and a level of a whole signal after the accumulation is amplified.

According to a sixth aspect of the present invention, a method of processing a signal includes the steps of extracting a high frequency component higher than a specific frequency from an audio signal with a high frequency component extracting unit; extracting a low frequency component lower than a specific frequency from the audio signal with a low frequency component extracting unit; amplifying a level of the high frequency component extracted with the high frequency component extracting unit with a first gain with a first adjusting unit; amplifying or attenuating a level of the low frequency component extracted with the low frequency component extracting unit with a second gain with a second adjusting unit; and accumulating the high frequency component adjusted with the first adjusting unit and the low frequency component adjusted with the second adjusting unit with a accumulating unit.

According to the sixth aspect of the present invention, the method of processing the signal further includes the steps of detecting the level of the high frequency component adjusted with the first adjusting unit with a high frequency level detecting unit; detecting the level of the low frequency component adjusted with the second adjusting unit with a low frequency level detecting unit; controlling the first gain according to the level of the high frequency component detected with the high frequency level detecting unit with a first control unit so that the first adjusting unit amplifies the level of the high frequency component to a target level; and controlling the second gain according to the level of the high frequency component detected with the high frequency level detecting unit and the level of the low frequency component detected with the low frequency level detecting unit with a second control unit so that a difference between the level of the high frequency component adjusted with the first adjusting unit and the level of the low frequency component adjusted with the second adjusting unit becomes smaller than a specific level determined in advance.

As described above, in the method of processing the signal in the sixth aspect of the present invention, it is possible to obtain an effect similar to that in the first aspect of the present invention. Accordingly, in the signal processing apparatus in the first aspect of the present invention, it is possible to obtain an audio signal with better quality for being easily discernable as compared with a conventional method of processing a signal, in which a level of a low frequency component is attenuated and accumulated with a high frequency component without adjusting a level, and a level of a whole signal after the accumulation is amplified.

As described above, in the present invention, it is possible to obtain an audio signal with high quality for being easily discernable as well as reduce a wind noise.

BRIEF DESCRIPTION OF THE DRAWINGS

FIGS. 1(A) and 1(B) are block diagram showing a configuration of a signal processing apparatus according to a first embodiment of the present invention, wherein FIG. 1(A) is a block diagram showing the configuration of the signal processing apparatus.

FIGS. 3(A) to 3(C) are graphs showing an operation of the signal processing apparatus according to the first embodiment of the present invention, wherein

DETAILED DESCRIPTION OF PREFERRED EMBODIMENTS

Hereunder, preferred embodiments of the present invention will be explained with reference to the accompanying drawings.

Figure 1A:
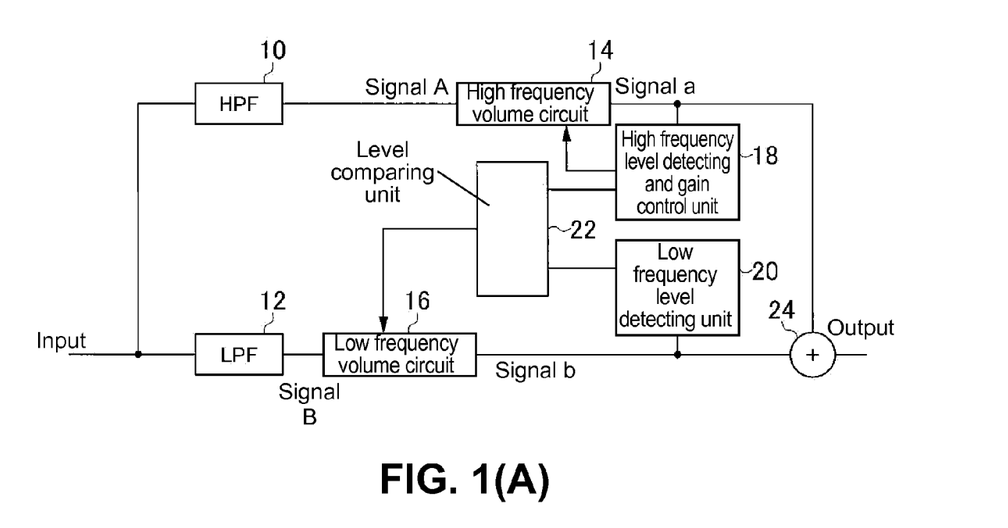
Figure 1B:
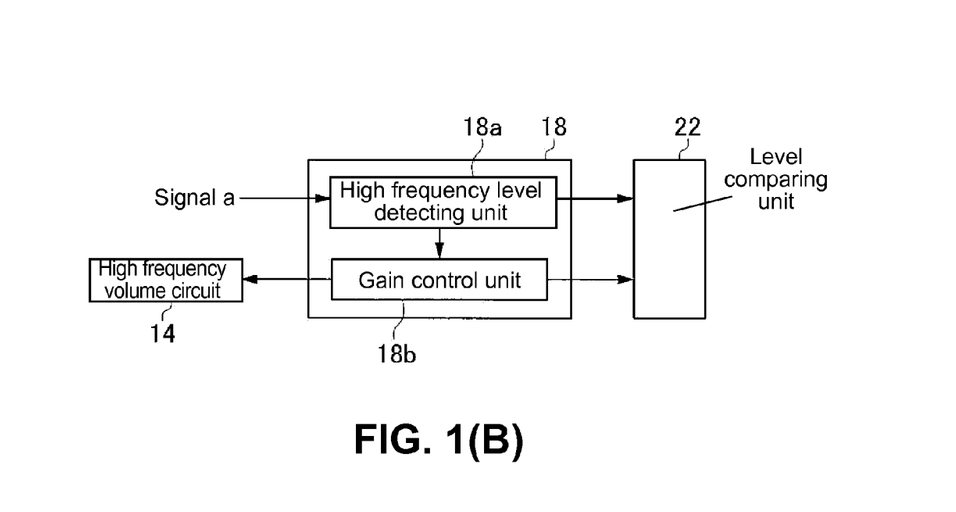
FIG. 1(B) is a block diagram showing a configuration of a high frequency level detecting and gain control unit of the signal processing apparatus.

A first embodiment of the present invention will be explained. FIGS. 1(A) and 1(B) are block diagram showing a configuration of a signal processing apparatus according to the first embodiment of the present invention. More specifically, FIG. 1(A) is a block diagram showing the configuration of the signal processing apparatus, and FIG. 1(B) is a block diagram showing a configuration of a high frequency level detecting and gain control unit 18 of the signal processing apparatus.

Figure 2:
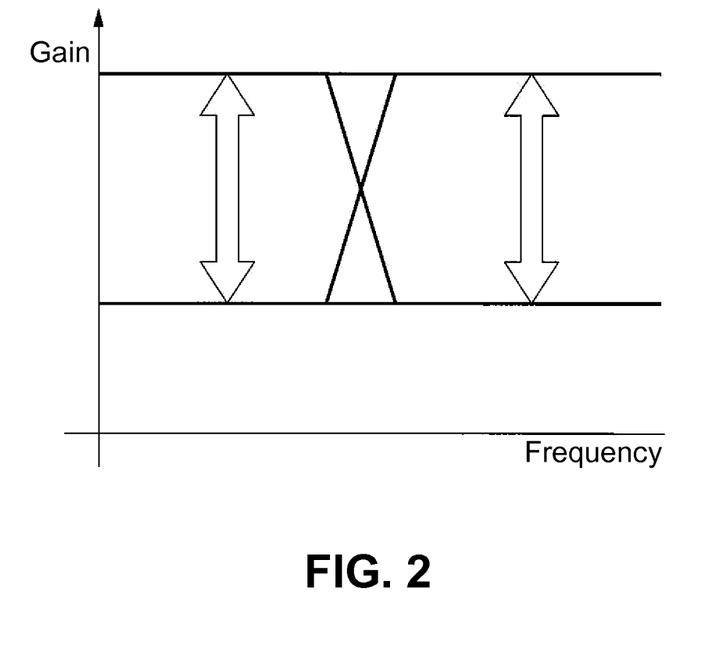
FIG. 2 is a graph showing a frequency characteristic of the signal processing apparatus according to the first embodiment of the present invention.

FIG. 2 is a graph showing a frequency characteristic of the signal processing apparatus according to the first embodiment of the present invention. As shown in FIG. 2, with the signal processing apparatus in the first embodiment of the present invention, it is possible to change both a volume of a high frequency component and a volume of a low frequency component.

As shown in FIG. 1(A), the signal processing apparatus is disposed on a recording path for recording an audio signal input thereto. The signal processing apparatus includes a high pass filter 10 (an HPF 10); a low pass filter 12 (an LPF 12); a high frequency volume circuit 14; a low frequency volume circuit 16; the high frequency level detecting and gain control unit 18; a low frequency level detecting unit 20; a level comparing unit 22; and an accumulating unit 24.

In the embodiment, the HPF 10 is arranged to receive the audio signal input through a microphone (not shown). Further, the HPF 10 is provided for extracting a high frequency component higher than a specific frequency determined in advance from the audio signal thus input, and for outputting the high frequency component. In other words, the HPF 10 is a filter for extracting a signal in a frequency range where a wind noise does not have a significant influence. It is noted that a signal (referred to as a signal A) passing through the HPF 10 is within a frequency range containing human voices.

In the embodiment, the signal A output from the HPF 10 is input into the high frequency volume circuit 14, so that the high frequency volume circuit 14 amplifies the signal A thus input with a first gain, thereby adjusting a volume level (referred to as a level) of the high frequency component. After the high frequency volume circuit 14 amplifies the signal A with the first gain, the signal A thus amplified (referred to as a signal a) is input into the accumulating unit 24 and the high frequency level detecting and gain control unit 18.

As shown in FIG. 1(B), the high frequency level detecting and gain control unit 18 includes a high frequency level detecting unit 18a and a gain control unit 18b. The high frequency level detecting unit 18a is provided for detecting a level of the signal a thus input through, for example, an envelope wave detection process. After the high frequency level detecting unit 18a detects the level (referred to as a high frequency detected level), the high frequency detected level is input into the gain control unit 18b and the level comparing unit 22.

In the embodiment, the gain control unit 18b is provided for determining the first gain according to the high frequency detected level thus input, so that the signal A is amplified to a targeted level (referred to as a target level). Further, the gain control unit 18b is provided for inputting the first gain thus determined into the level comparing unit 22, and for setting the first gain thus determined to the high frequency volume circuit 14. For example, the high frequency detected level may be compared with the target level determined in advance, so that the gain control unit 18b determines the first gain according to a comparison result. Alternatively, the high frequency detected level may be compared with a range determined in advance including the target level, so that the gain control unit 18b determines the first gain according to a comparison result.

More specifically, for example, when the high frequency detected level is equal to the target level L1 determined in advance, the gain control unit 18b determines the first gain to be equal to the first gain set when the high frequency detected level is detected. When the high frequency detected level is smaller than the target level L1, the gain control unit 18b determines the first gain to be greater than the first gain set when the high frequency detected level is detected. When the high frequency detected level is greater than the target level L1, the gain control unit 18b determines the first gain to be smaller than the first gain set when the high frequency detected level is detected.

Further, it is supposed that the range has a lower limit L2 and an upper limit L3, and the target level L1 is within the range (L2<L1<L3). When the high frequency detected level is within the range including the target level L1, the gain control unit 18b determines the first gain to be equal to the first gain set when the high frequency detected level is detected. When the high frequency detected level is smaller than the lower limit L2 of the range, the gain control unit 18b determines the first gain to be greater than the first gain set when the high frequency detected level is detected. When the high frequency detected level is greater than the upper limit L3 of the range, the gain control unit 18b determines the first gain to be smaller than the first gain set when the high frequency detected level is detected.

In the embodiment, the target level L1 is set to be within the range (L2<L1<L3), so that the gain control unit 18b does not determine the first gain to be excessively high or low.

As described above, the high frequency level detecting and gain control unit 18 is formed of a configuration of an auto level controller (ALC). Accordingly, the signal A input from the HPF 10 is amplified and adjusted with the first gain.

In the embodiment, it is configured such that the audio signal input through the microphone (not shown) is input also into the LPF 12, so that the LPF 12 extracts a low frequency component lower than the specific frequency determined in advance from the audio signal thus input, and outputs the high frequency component. It is noted that a signal passing through the LPF 12 is referred to as a signal B.

In the embodiment, the signal B output from the LPF 12 is input into the low frequency volume circuit 16, so that the high frequency volume circuit 14 amplifies or attenuates the signal B thus input with a second gain determined with the level comparing unit 22 (described later), thereby adjusting a volume level of the low frequency component. After the low frequency volume circuit 16 amplifies or attenuates the signal B with the second gain, the signal B thus amplified or attenuated (referred to as a signal b) is input into the accumulating unit 24 and the low frequency level detecting unit 20.

In the embodiment, the low frequency level detecting unit 20 is provided for detecting a level of the signal b thus input through, for example, an envelope wave detection process. After the low frequency level detecting unit 20 detects the level (referred to as a low frequency detected level), the low frequency detected level is input into the level comparing unit 22.

In the embodiment, the accumulating unit 24 is provided for accumulating or combining the signal a input from the high frequency volume circuit 14 and the signal b input from the low frequency volume circuit 16 to generate an accumulated signal, and for outputting the accumulated signal as a recording signal, so that a recording device stores or records the recording signal. A filter may be disposed as a later stage of the accumulating unit 24 for reducing a specific frequency noise generated according to a mounted device, so that a signal passing through the filter may be output.

In the embodiment, the level comparing unit 22 is provided for controlling the second gain of the low frequency volume circuit 16. More specifically, the level comparing unit 22 is provided for controlling the second gain of the low frequency volume circuit 16 such that a difference between the level of the high frequency component adjusted with the high frequency volume circuit 14 and the level of the low frequency component adjusted with the low frequency volume circuit 16 becomes smaller than a level determined in advance.

In the embodiment, similar to the first gain, the second gain is set to be within a range having a lower limit and an upper limit, so that the level comparing unit 22 does not set the second gain to be excessively high or low.

Figure 3A:
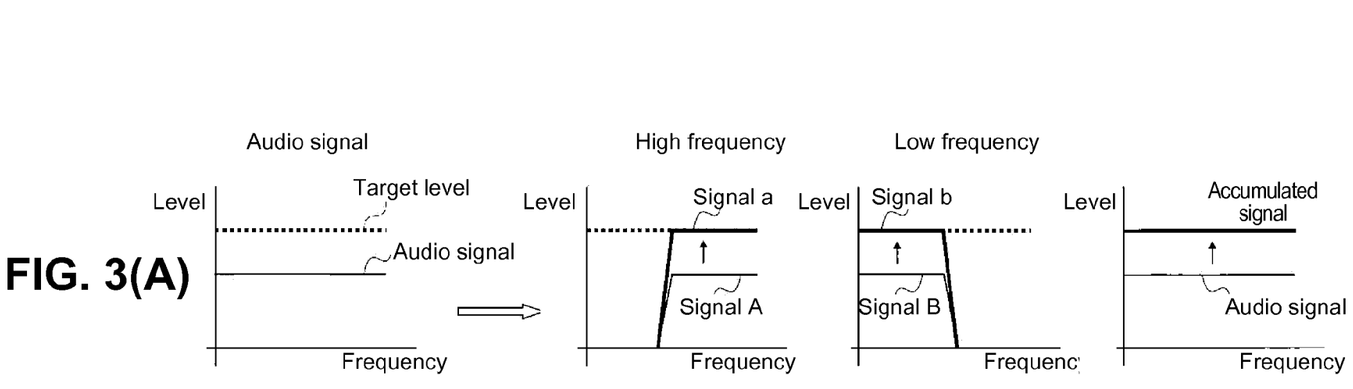
FIG. 3(A) is graphs showing the operation of the signal processing apparatus when a high frequency component has a level similar to that of a low frequency component.
Figure 3B:
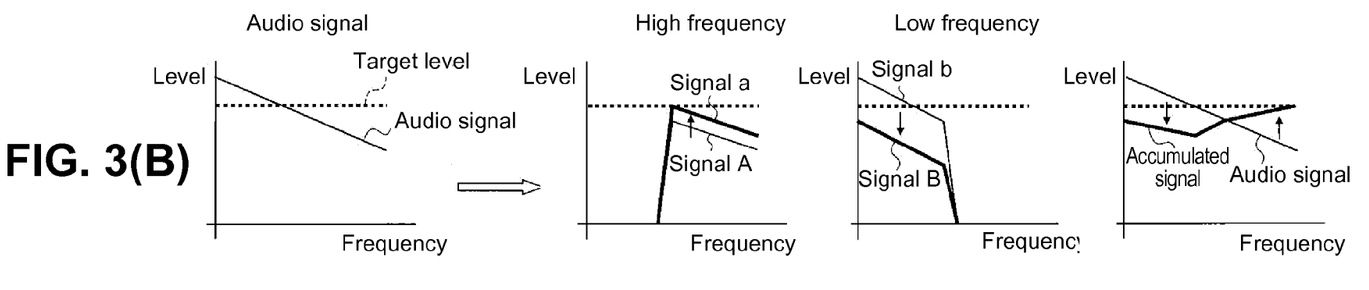
FIG. 3(B) is graphs showing the operation of the signal processing apparatus when the high frequency component has a level smaller than that of the low frequency component.
Figure 3C:
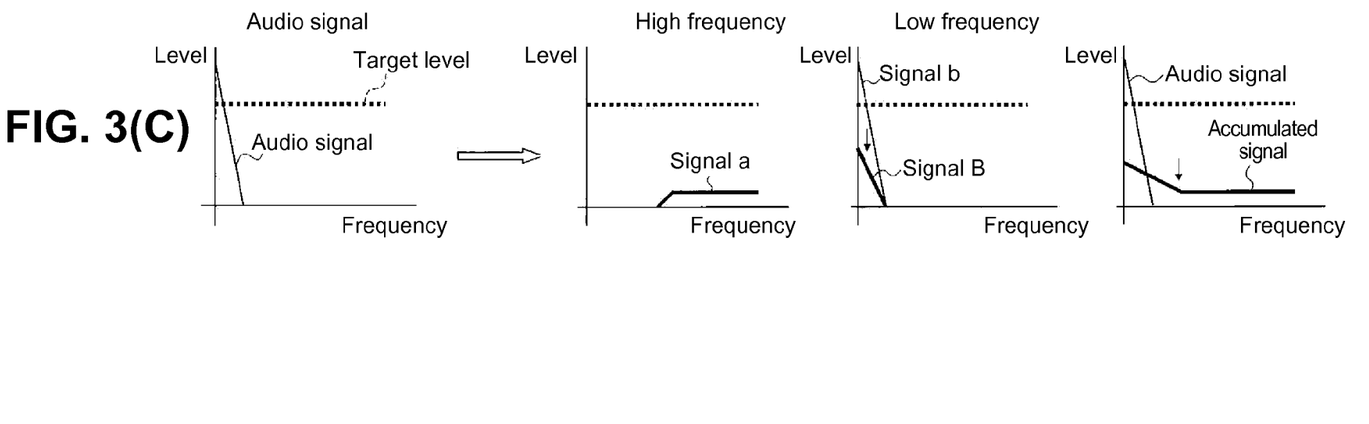
FIG. 3(C) is graphs showing the operation of the signal processing apparatus when the high frequency component has a level significantly smaller than that of the low frequency component.

An operation of controlling the second gain will be explained next with reference to FIGS. 3(A) to 3(C). FIGS. 3(A) and 3(B) are graphs showing an operation of the signal processing apparatus according to the first embodiment of the present invention. More specifically, FIG. 3(A) is graphs showing the operation of the signal processing apparatus when the high frequency component has the level similar to that of the low frequency component, FIG. 3(B) is graphs showing the operation of the signal processing apparatus when the high frequency component has the level smaller than that of the low frequency component, and FIG. 3(C) is graphs showing the operation of the signal processing apparatus when the high frequency component has the level significantly smaller than that of the low frequency component.

In the embodiment, the level comparing unit 22 is provided for determining whether the high frequency detected level is within the range explained above (between the lower limit L2 and the upper limit L3). When the level comparing unit 22 determines that the high frequency detected level is within the range, the level comparing unit 22 determines whether the low frequency detected level is smaller than the upper limit L3 of the range. When the level comparing unit 22 determines that the low frequency detected level is smaller than the upper limit L3 of the range, the level comparing unit 22 sets the second gain of the low frequency volume circuit 16 so that the signal B is amplified with the gain equal to the first gain of the high frequency volume circuit 14.

As described above, when the audio signal having the high frequency component with the level similar to that of the low frequency component is input, the level comparing unit 22 sets the second gain of the low frequency volume circuit 16 equal to the first gain of the high frequency volume circuit 14. FIG. 3(A) is the graphs showing the operation of the signal processing apparatus when the high frequency component has the level similar to that of the low frequency component. As shown in FIG. 3(A), the audio signal thus input is amplified at both the high frequency range and the low frequency range, so that the audio signal is amplified to a level equal to the target level.

Even when the second gain of the low frequency volume circuit 16 is set equal to the first gain of the high frequency volume circuit 14, and the audio signal thus input is amplified at both the high frequency range and the low frequency range, depending on the audio signal, the low frequency detected level may exceeds the upper limit L3 even though the high frequency detected level is within the range. In this case, it is considered that the audio signal this input contains a large wind noise. Accordingly, the second gain VolL (db) is set to be a value smaller than the first gain VolH (db) input from the gain control unit 18b by a value α (db) determined in advance according to the following equation (1):

$$VolL = VolH - \alpha \quad (1)$$

FIG. 3(B) is graphs showing the operation of the signal processing apparatus when the high frequency component has the level smaller than that of the low frequency component. As shown in FIG. 3(B), the audio signal is amplified such that the high frequency component thereof becomes the target level, and the low frequency component thereof is attenuated with the second gain, thereby reducing the wind noise. With the operation, the difference between the low frequency component from and the high frequency component thus amplified becomes smaller than the level determined in advance.

When the high frequency detected level is smaller than the lower limit L2 of the range, it is indicated that the level of the high frequency level is excessively small. In this case, the second gain is adjusted such that the low frequency component is attenuated with a larger gain. Accordingly, the level of the low frequency component does not become too large as compared with the level of the high frequency component.

More specifically, the second gain VolL (db) is set to be a value smaller than the first gain VolH (db) input from the gain control unit 18b by a value β (db) (note that β>α) determined in advance according to the following equation (2):

$$VolL = VolH - \beta \quad (2)$$

FIG. 3(C) is graphs showing the operation of the signal processing apparatus when the high frequency component has the level significantly smaller than that of the low frequency component. As shown in FIG. 3(C), the low frequency component of the audio signal is significantly attenuated such that the level of the low frequency component becomes excessively greater than the level of the high frequency component after the high frequency component is amplified. In other words, the low frequency component of the audio signal is attenuated such that the difference between the low frequency component from and the high frequency component thus amplified becomes smaller than the level determined in advance.

As explained above, the level comparing unit 22 is provided for comparing the high frequency detected level and the low frequency detected level with the range determined in advance. Alternatively, the level comparing unit 22 may compare the high frequency detected level and the low frequency detected level with the target level L1 determined in advance, thereby controlling the second gain.

More specifically, the level comparing unit 22 is provided for determining whether the high frequency detected level is equal to the target level L1 determined in advance. When the level comparing unit 22 determines that the high frequency detected level is equal to the target level L1, the level comparing unit 22 determines whether the low frequency detected level is smaller than the target level L1. When the level comparing unit 22 determines that the low frequency detected level is smaller than the target level L1, the level comparing unit 22 sets the second gain of the low frequency volume circuit 16 so that the signal B is amplified with the gain equal to the first gain of the high frequency volume circuit 14 (refer to FIG. 3(A)).

When the level comparing unit 22 determines that the high frequency detected level is equal to the target level L1 and the low frequency detected level is greater than the target level L1, the level comparing unit 22 sets the second gain of the low frequency volume circuit 16 according to the equation (1), so that the signal B is attenuated (refer to FIG. 3(B)). When the level comparing unit 22 determines that the high frequency detected level is smaller than the target level L1, the level comparing unit 22 sets the second gain of the low frequency volume circuit 16 according to the equation (2), so that the low frequency component is significantly attenuated (refer to FIG. 3(C)).

In the embodiment, when the gain control unit 18b and the level comparing unit 22 set the gain, the gain control unit 18b and the level comparing unit 22 may change the gain to the target level all at once. Alternatively, it is possible to set an attack time or a decay time. When the attack time is set, the gain control unit 18b and the level comparing unit 22 change the gain to the target during the attack time. When the decay time is set, after the gain control unit 18b and the level comparing unit 22 change the gain to the target, the gain control unit 18b and the level comparing unit 22 return the gain to the original level during the decay time. Accordingly, it is possible to alleviate an unpleasant hearing sensation when the gain increases or decreases.

As explained above, in the embodiment, before the signal processing apparatus generates the accumulated signal, the level of the audio signal is adjusted both at the high frequency side and the low frequency side. Accordingly, it is not necessary to provide an auto level controller (ALC) for adjusting the level of the accumulated signal on the output side of the signal processing apparatus (the later stage of the accumulating unit 24).

A conventional signal processing apparatus is provided with an auto level controller (ALC) at the later stage of the accumulating unit 24. When the audio signal as shown in FIG. 3(B) is input into the conventional signal processing apparatus, after the low frequency component is attenuated, the low frequency component is accumulated with the high frequency component without adjusting the level thereof. Then, the ALC disposed at the later stage determines the gain according to the level of the accumulated signal as a whole. In other words, the ALC increases the gain to the target level according to the level of the accumulated signal not only containing a human voice (the high frequency component) but also the low frequency component attenuated at the front stage. Accordingly, the ALC amplifies the low frequency component attenuated at the front stage, thereby making it difficult to make the human voice easier to listen.

Further, when the audio signal as shown in FIG. 3(C), in which the high frequency component is significantly small, is input into the conventional signal processing apparatus, the ALC disposed at the later stage amplifies an entire portion of the accumulated signal. Accordingly, the low frequency component such as an environmental noise tends to be unnecessarily magnified.

As described above, in the signal processing apparatus in the embodiment, the first gain is optimized so that the high frequency component as the component to be easily discernable to a human becomes the target level. Afterward, the low frequency component containing the environmental noise is adjusted (that is, the second gain is determined). Lastly, the high frequency component and the low frequency component thus adjusted are combined. Accordingly, it is possible to obtain the audio signal with better quality for being easily discernable as compared with the conventional signal processing apparatus, in which only the low frequency component is adjusted and accumulated with the high frequency component without adjusting a level, and the ALC at the later stage amplifies the accumulated signal.

In the embodiment, the signal processing apparatus may be applicable to a device using a microphone. Further, a recording device may be provided for recording (storing) the audio signal output from the signal processing apparatus. In this case, the signal processing apparatus and the recording device constitute a signal processing system. Further, the signal processing apparatus may be disposed in a large scale integrated circuit (LSI) for recording an audio signal captured through a microphone.

Further, the signal processing system may be provided with an analog signal processing unit having an amplifier circuit for amplifying an analog signal captured through a microphone and a conversion circuit for converting the analog signal thus amplified to a digital signal. In this case, the analog signal processing unit is connected to the front stage (the input side) of the signal processing apparatus. Accordingly, after the analog signal processing unit converts the analog signal to the digital signal, the digital signal is input into the HPF 10 and LPF 12 of the signal processing apparatus, so that the signal processing apparatus processes the digital signal through the operation described above.

Further, the recording device may be provided for recording (storing) the digital signal processed with the signal processing apparatus at the later stage (the output side) thereof. In this case, the signal processing apparatus and the recording device constitute the signal processing system for recording (storing) the digital signal captured through a microphone.

Further, the signal processing apparatus may be disposed on a path for outputting the audio signal to a speaker and the like. In this case, the accumulated signal accumulated (combined) with the accumulating unit 24 is output as a speaker output signal, so that the signal processing apparatus and the speaker constitute a system.

The disclosure of Japanese Patent Application No. 2010-162179, filed on Jul. 16, 2010, is incorporated in the application by reference.

While the invention has been explained with reference to the specific embodiments of the invention, the explanation is illustrative and the invention is limited only by the appended claims.

What is claimed is:

1. A signal processing apparatus, comprising:
a high frequency component extracting circuit configured to extract a high frequency component higher than a first specific frequency from an audio signal;
a low frequency component extracting circuit configured to extract a low frequency component lower than a second specific frequency from the audio signal;
a first adjusting circuit configured to amplify a level of the high frequency component with a first gain;

a second adjusting circuit configured to amplify or attenuate a level of the low frequency component with a second gain;

an accumulating circuit configured to accumulate the high frequency component adjusted with the first adjusting circuit and the low frequency component adjusted with the second adjusting circuit;

a high frequency level detecting circuit configured to detect the level of the high frequency component adjusted with the first adjusting circuit;

a low frequency level detecting circuit configured to detect the level of the low frequency component adjusted with the second adjusting circuit;

a first control circuit configured to control the first gain according to the level of the high frequency component detected with the high frequency level detecting circuit so that the first adjusting circuit amplifies the level of the high frequency component to a target level; and a second control circuit configured to control the second gain according to the level of the high frequency component and the level of the low frequency component so that a difference between the level of the high frequency component adjusted with the first adjusting circuit and the level of the low frequency component adjusted with the second adjusting circuit becomes smaller than a specific level determined in advance, wherein said second control circuit is arranged to control the second gain so that the second adjusting circuit attenuates the level of the low frequency component with the second gain smaller than the first gain by a first value determined in advance when the level of the high frequency component detected with the high frequency level detecting circuit is equal to the target level and the level of the low frequency component detected with the low frequency level detecting circuit is greater than the target level, and said second control circuit is arranged to control the second gain so that the second adjusting circuit attenuates the level of the low frequency component with the second gain smaller than the first gain by a second value greater than the first value when the level of the high frequency component detected with the high frequency level detecting circuit is smaller than the target level.

2. The signal processing apparatus according to claim 1, wherein said second control circuit is arranged to control the second gain so that the second adjusting circuit amplifies the level of the low frequency component with the second gain equal to the first gain when the level of the high frequency component detected with the high frequency level detecting circuit is equal to the target level and the level of the low frequency component detected with the low frequency level detecting circuit is smaller than the target level.

3. The signal processing apparatus according to claim 1, wherein said second control circuit is arranged to control the second gain so that the second adjusting circuit amplifies the level of the low frequency component with the second gain equal to the first gain when the level of the high frequency component detected with the high frequency level detecting circuit is within a range determined in advance including the target level and the level of the low frequency component detected with the low frequency level detecting circuit is smaller than an upper limit of the range.

4. The signal processing apparatus according to claim 3, wherein said second control circuit is arranged to control the second gain so that the second adjusting circuit attenuates the level of the low frequency component with the second gain smaller than the first gain by a first value determined in advance when the level of the high frequency component detected with the high frequency level detecting circuit is within the range and the level of the low frequency component detected with the low frequency level detecting circuit is greater than the upper limit of the range.

5. The signal processing apparatus according to claim 4, wherein said second control circuit is arranged to control the second gain so that the second adjusting circuit attenuates the level of the low frequency component with the second gain smaller than the first gain by a second value greater than the first value when the level of the high frequency component detected with the high frequency level detecting circuit is smaller than a lower limit of the range.

6. A semiconductor chip comprising the signal processing apparatus according to claim 1.

7. The signal processing apparatus according to claim 1, wherein said high frequency component extracting unit is formed of a high pass filter;

said low frequency component extracting unit is formed of a low pass filter;

said first adjusting unit is formed of a high frequency volume circuit; and said second adjusting unit is formed of a low frequency volume circuit.

8. A signal processing system, comprising:

an input device including an analog amplifying circuit configured to amplify an analog audio signal and a conversion circuit configured to convert the analog audio signal amplified with the analog amplifying circuit to a digital audio signal;

a signal processing apparatus; and a storage circuit configured to store an audio signal, wherein said signal processing apparatus comprises: a high frequency component extracting circuit configured to extract a high frequency component higher than a specific frequency from the digital audio signal converted with the conversion circuit of the input device;

a low frequency component extracting circuit configured to extract a low frequency component lower than a specific frequency from the digital audio signal converted with the conversion circuit of the input device;

a first adjusting circuit configured to amplify a level of the high frequency component extracted with the high frequency component extracting circuit with a first gain;

a second adjusting circuit configured to amplify or attenuate a level of the low frequency component extracted with the low frequency component extracting circuit with a second gain;

an accumulating circuit configured to accumulate the high frequency component adjusted with the first adjusting circuit and the low frequency component adjusted with the second adjusting circuit;

a high frequency level detecting circuit configured to detect the level of the high frequency component adjusted with the first adjusting circuit;

a low frequency level detecting circuit configured to detect the level of the low frequency component adjusted with the second adjusting circuit;

a first control circuit configured to control the first gain according to the level of the high frequency component detected with the high frequency level detecting circuit so that the first adjusting circuit amplifies the level of the high frequency component to a target level; and a second control circuit configured to control the second gain according to the level of the high frequency component detected with the high frequency level detecting circuit and the level of the low frequency component detected with the low frequency level detecting circuit so that a difference between the level of the high frequency component adjusted with the first adjusting circuit and the level of the low frequency component adjusted with the second adjusting circuit becomes smaller than a specific level determined in advance, said second control circuit is arranged to control the second gain so that the second adjusting circuit attenuates the level of the low frequency component with the second gain smaller than the first gain by a first value determined in advance when the level of the high frequency component detected with the high frequency level detecting circuit is equal to the target level and the level of the low frequency component detected with the low frequency level detecting circuit is greater than the target level, and said second control circuit is arranged to control the second gain so that the second adjusting circuit attenuates the level of the low frequency component with the second gain smaller than the first gain by a second value greater than the first value when the level of the high frequency component detected with the high frequency level detecting circuit is smaller than the target level.

9. The signal processing system according to claim 8, wherein said high frequency component extracting unit is formed of a high pass filter;

said low frequency component extracting unit is formed of a low pass filter;

said first adjusting unit is formed of a high frequency volume circuit; and said second adjusting unit is formed of a low frequency volume circuit.

10. A method of processing a signal comprising the steps of:

extracting a high frequency component higher than a specific frequency from an audio signal with a high frequency component extracting unit;

extracting a low frequency component lower than a specific frequency from the audio signal with a low frequency component extracting unit;

amplifying a level of the high frequency component extracted with the high frequency component extracting unit with a first gain with a first adjusting unit;

amplifying or attenuating a level of the low frequency component extracted with the low frequency component extracting unit with a second gain with a second adjusting unit;

accumulating the high frequency component adjusted with the first adjusting unit and the low frequency component adjusted with the second adjusting unit with an accumulating unit;

detecting the level of the high frequency component adjusted with the first adjusting unit with a high frequency level detecting unit;

detecting the level of the low frequency component adjusted with the second adjusting unit with a low frequency level detecting unit;

controlling the first gain according to the level of the high frequency component detected with the high frequency level detecting unit with a first control unit so that the first adjusting unit amplifies the level of the high frequency component to a target level; and controlling the second gain according to the level of the high frequency component detected with the high frequency level detecting unit and the level of the low frequency component detected with the low frequency level detecting unit with a second control unit so that a difference between the level of the high frequency component adjusted with the first adjusting unit and the level of the low frequency component adjusted with the second adjusting unit becomes smaller than a specific level determined in advance, wherein said second gain is controlled so that the second adjusting unit attenuates the level of the low frequency component with the second gain smaller than the first gain by a first value determined in advance when the level of the high frequency component detected with the high frequency level detecting unit is equal to the tar et level and the level of the low frequency component detected with the low frequency level detecting unit is greater than the target level, and said second gain is controlled so that the second adjusting unit attenuates the level of the low frequency component with the second gain smaller than the first gain by a second value greater than the first value when the level of the high frequency component detected with the high frequency level detecting unit is smaller than the target level.

* * * * *